(12) United States Patent
Yu

(10) Patent No.: US 9,178,051 B2
(45) Date of Patent: Nov. 3, 2015

(54) SEMICONDUCTOR DEVICE

(75) Inventor: Man-jong Yu, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 656 days.

(21) Appl. No.: 13/451,777

(22) Filed: Apr. 20, 2012

(65) Prior Publication Data

US 2012/0267712 A1 Oct. 25, 2012

(30) Foreign Application Priority Data

Apr. 20, 2011 (KR) ........................ 10-2011-0036850

(51) Int. Cl.
| | |
|---|---|
| *H01L 29/78* | (2006.01) |
| *H01L 29/423* | (2006.01) |
| *H01L 29/66* | (2006.01) |
| *H01L 27/105* | (2006.01) |
| *H01L 27/108* | (2006.01) |

(52) U.S. Cl.
CPC ............ *H01L 29/78* (2013.01); *H01L 27/1052* (2013.01); *H01L 27/10876* (2013.01); *H01L 29/4236* (2013.01); *H01L 29/66621* (2013.01)

(58) Field of Classification Search
CPC ............ H01L 21/8239; H01L 27/1023; H01L 27/1025; H01L 27/1026; H01L 27/108; H01L 27/10805; H01L 27/11; H01L 27/112; H01L 27/11502; H01L 27/11585; H01L 45/04
USPC ......... 257/225, 260, 261, 296, 300, 304, 305, 257/311, 314, 315, 326, 390, E21.209, 257/E21.526, E21.613, E21.645, E21.646, 257/E21.66, E21.661, E21.662, E21.663, 257/E21.665, E21.678, E21.679, E21.68, 257/E21.683, E21.691, E27.075, E27.076, 257/E27.077, E27.078, E27.08, 4, E27.085, 257/E27.098, E27.102, E27.104, E27.17, 257/E29.309, E29.33, 903, 905, 906, 907, 257/908, 910
See application file for complete search history.

(56) References Cited

U.S. PATENT DOCUMENTS

| | | | | |
|---|---|---|---|---|
| 6,236,078 | B1 * | 5/2001 | Yoshida et al. | ............... 257/306 |
| 7,589,369 | B2 | 9/2009 | Haller | |
| 2007/0037345 | A1 | 2/2007 | Manger | |
| 2007/0170497 | A1 * | 7/2007 | Baek | .............................. 257/328 |
| 2008/0081447 | A1 * | 4/2008 | Jang et al. | ..................... 438/589 |
| 2010/0059805 | A1 * | 3/2010 | Lee et al. | ...................... 257/296 |
| 2011/0101450 | A1 * | 5/2011 | Kim | ............................... 257/330 |

FOREIGN PATENT DOCUMENTS

| | | |
|---|---|---|
| KR | 10-2007-0027951 A | 3/2007 |
| KR | 10-2010-0091482 A | 8/2010 |

* cited by examiner

*Primary Examiner* — Mohammad Choudhry
(74) *Attorney, Agent, or Firm* — Lee & Morse, P.C.

(57) ABSTRACT

A semiconductor device includes an active region on a semiconductor substrate. The active region is defined by a device isolation layer and includes gate-recesses. The semiconductor device further includes gate electrodes in the gate-recesses, a contact recess in the active region between the gate-recesses, a cell pad that covers at least a portion of the active region between the gate-recesses and that fills at least a portion of the contact recess, and a bit line electrically connected to the cell pad.

15 Claims, 10 Drawing Sheets

SEMICONDUCTOR DEVICE

CROSS-REFERENCE TO RELATED APPLICATIONS

This application claims the benefit of Korean Patent Application No. 10-2011-0036850, filed on Apr. 20, 2011, in the Korean Intellectual Property Office, the disclosure of which is incorporated herein in its entirety by reference.

BACKGROUND

It is desirable to increase integration density of semiconductor devices, for example, by increasing a number of devices on a further reduced area without sacrificing performance of the devices. For this purpose, many studies have been conducted to change the locations and directions of word lines and bit lines and shapes and structures of entire devices. However, there is still much room for improvement in structures of semiconductor devices to further increase the integration density while maintaining a high performance of the semiconductor devices.

SUMMARY

According to an aspect, there is provided a semiconductor device, including an active region on a semiconductor substrate, the active region being defined by a device isolation layer and including gate-recesses, gate electrodes in the gate-recesses, a contact recess in a portion of the active region between the gate-recesses; a cell pad that covers at least a portion of the active region between the gate-recesses and that fills at least the portion of the contact recess; and a bit line electrically connected to the cell pad.

An upper surface of the gate electrode may be lower than an upper surface of the active region, and a space between the upper surface of the gate electrode and the upper surface of the active region is filled with an insulating material.

A lowermost bottom surface of the contact recess may be higher than the upper surface of the gate electrode.

The contact recess may be in the portion of the active region between the gate-recesses and may extend across a boundary of the active region.

The portion of the active region between the gate-recesses may be completely covered by the cell pad.

The cell pad may contact at least a portion of a side surface of the active region exposed by the contact recess.

The portion of the active region between the gate-recesses may have a protrusion shape at a center of the contact recess. The cell pad may cover the side surface and an upper surface of the active region having the protrusion shape.

The bit line may be electrically connected to the cell pad through a cell direct contact.

A contact area between the portion of the active region between the gate-recesses and the cell pad may be greater than a cross-sectional area in a plane direction of the active region that overlaps with the cell pad.

The cell pad may be formed by a selective epitaxial growth method.

An upper surface of the cell pad may have an upwardly convex shape.

The cell pad and the cell direct contact may be formed as one body.

A semiconductor memory module may include the semiconductor device. A system may include the semiconductor device.

According to another aspect, there is provided a semiconductor device including an active region on a semiconductor substrate, the active region being defined by a device isolation layer and including at least one gate-recess, a gate electrode in the gate-recess, a contact that contacts at least a portion of an upper surface of the active region and at least a portion of a lateral surface of the gate-recess, and a bit line connected to the contact. The contact may contact at least a portion of a lateral surface of a layer in the gate-recess. The semiconductor device may further include a capping layer in the gate-recess and on the gate electrode, and the contact may contact at least a portion of a lateral surface of the capping layer.

According to another aspect, there is provided a semiconductor device including an active region on a semiconductor substrate, a device isolation layer isolating the active region, a pair of gate-recesses traversing the active region to define a central portion of the active region between the pair of gate-recesses, the central portion including at least one lateral surface spaced apart from at least one of the gate recesses, and a contact that contacts an upper surface and the at least one lateral surface of the central portion of the active region.

The contact may overlap a portion of at least one of the gate-recesses.

The contact may overlap a portion of the device isolation layer adjacent to the central portion of the active layer.

The gate-recesses may include gate electrodes, the gate electrodes each having an upper surface that is lower than a lowermost bottom surface of the contact.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
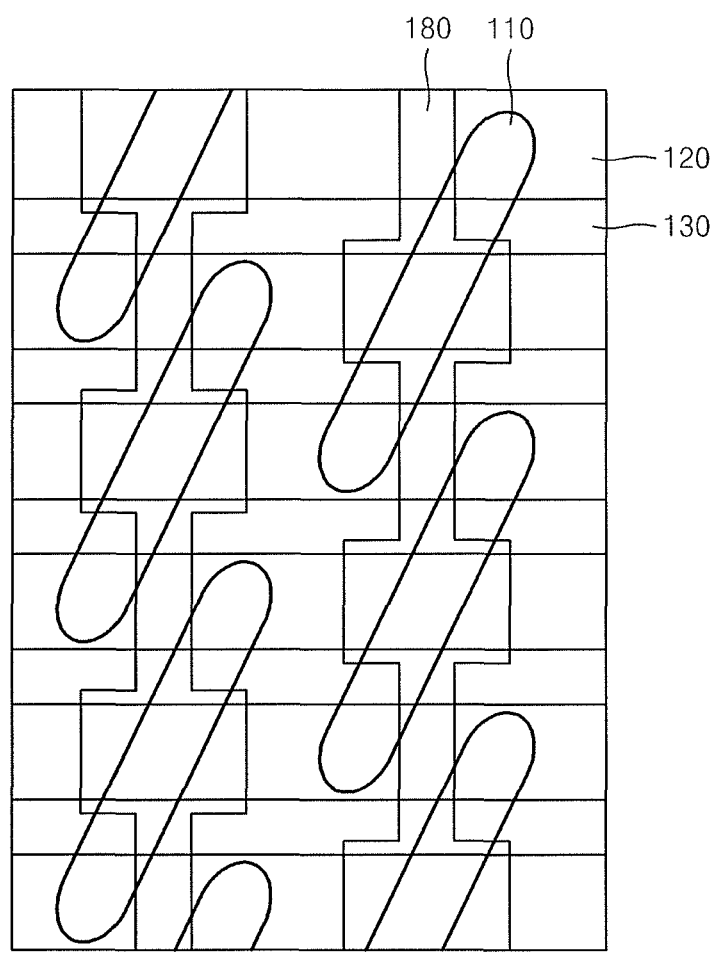
FIG. 1 illustrates a plan view of a layout of semiconductor devices according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting. The singular forms include the plural forms unless the context clearly indicates otherwise.

Unless otherwise defined, all terms (including technical and scientific terms) used herein have the same meaning as commonly understood by one of ordinary skill in the art to which this inventive concept belongs. It will be further understood that terms, such as those defined in commonly used in dictionaries, should be interpreted as having a meaning that is consistent with their meaning in the context of the relevant art and will not be interpreted in an idealized or overly formal senses unless expressly so defined herein.

The embodiments provide a semiconductor device including: active regions on a semiconductor substrate that includes gate-recesses that are divided by device isolation layers; gate electrodes in the gate-recesses; a contact recess formed between the gate-recesses and the active regions; a cell pad that covers at least a portion of the active regions between the gate-recesses and buries at least a portion of the contact recess; a cell direct contact electrically connected to the cell pad; and a bit line connected to the cell direct contact.

FIG. 1 is a plan view of a layout of semiconductor devices according to an embodiment. Referring to FIG. 1, active regions 110 are defined by device isolation layers 120 on a semiconductor substrate 100 (refer to FIGS. 7A through 7E).

The semiconductor substrate 100 may be a silicon semiconductor substrate, an silicon-on-insulator (SOI) semiconductor substrate, a GaAs semiconductor substrate, or a silicon germanium semiconductor substrate. The semiconductor substrate 100 may be a p-type semiconductor substrate or an n-type semiconductor substrate.

The device isolation layers 120 may be formed of, for example, a silicon oxide, by a shallow trench isolation (STI) method.

Word lines 130 may extend in a first direction with respect to the active regions 110. In FIG. 1, as an example, the word lines 130 extend through the active regions 110; however, other implementations are possible.

Also, bit lines 180 may extend in a second direction with respect to the active regions 110. In FIG. 1, as an example, widths of the bit lines 180 expand in regions where bit line contact plugs (not shown) are formed; however, other implementations are possible.

In FIG. 1, as an example, the major-axis of the active regions 110 is different from the first and second directions; however, in another implementation, the major-axis of the active regions 110 may coincide with the second direction. Also, the first direction and the second direction may or may not be perpendicular to each other.

The semiconductor devices in the layout of FIG. 1 may be, for example, cell regions of a semiconductor memory device.

Figure 2:
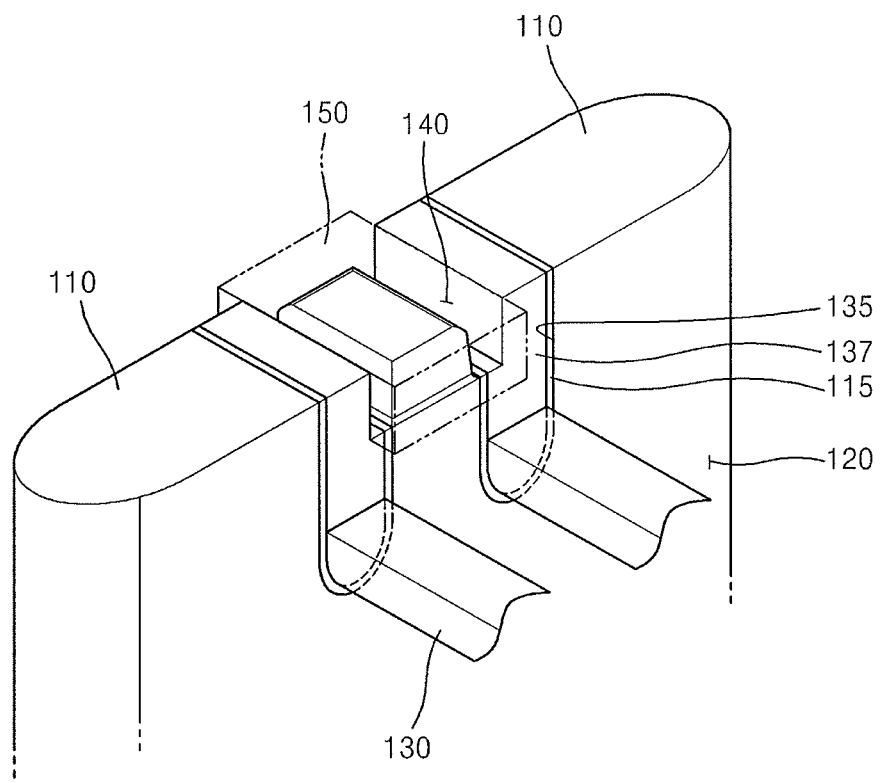
FIG. 2 illustrates a perspective view of a portion of a structure of a semiconductor device according to an embodiment.

FIG. 2 is a perspective view of a portion of a structure of a semiconductor device according to an embodiment. Referring to FIG. 2, gate-recesses 135 may be formed in the active region 110. In FIG. 2, as an example, a pair of gate-recesses 135 is formed in one active region 110; however, other implementations are possible.

Gate insulating layers 115 may be conformally formed on inner surfaces of the gate-recesses 135. The gate insulating layers 115 may be formed of at least one material selected from a silicon oxide, a silicon oxynitride, a germanium oxynitride, a germanium silicon oxide, a hafnium oxide, a zirconium oxide, an aluminum oxide, a tantalum oxide, a hafnium silicate, a zirconium silicate, and a combination of these materials. However, other implementations are possible.

The gate insulating layers 115 may be formed to have a thickness, for example, in a range from about 5 nm to about 20 nm.

The word line 130 may be formed on the gate insulating layers 115 to bury a portion of the gate-recess 135. The word line 130 may be a metal layer, for example, a metal such as tungsten (W) or a metal nitride layer such as titanium nitride TiN.

The word line 130 may function as a gate electrode of the semiconductor device on a portion of the word line 130 that overlaps the active region 110. An upper surface of the word line 130 may be positioned on a level lower than that of the highest upper surface of the active region 110.

A capping layer 137 formed of an insulating material may be formed on the word line 130. The capping layer 137 may be formed of, for example, a material selected from a silicon oxide, a silicon nitride, and a silicon oxynitride; however, other implementations are possible.

A junction region (not shown) to which dopant ions are injected may be formed in the active region 110. A lower interface of the junction region may be positioned on a level lower than an upper surface of the word line 130.

A contact recess 140 may be formed on at least a portion of a periphery of the active region 110 in an area between the gate-recesses 135. The contact recess 140 may be a space formed adjacent to a protruded portion of the active region 110 between the pair of the adjacent gate-recesses 135 and may provide a space where a cell pad 150 (refer to FIG. 3), which is a conductor, is to be later formed. In FIG. 2, as an example, the contact recess 140 is formed all around the protruded portion of the active region 110; however, other implementations are possible. The contact recess 140 may be formed to expose at least a portion of the junction region of the active region 110.

A portion of the upper surface of the active region 110 where the cell pad 150 is formed may be lower than other upper surfaces of the active region 110. For example, when the cell pad 150 is formed, an upper surface of the cell pad 150 may be substantially co-planar with the other upper surfaces of the active region 110.

The lowermost bottom surface of the contact recess 140 may be higher than the upper surface of the word lines 130.

Figure 3:
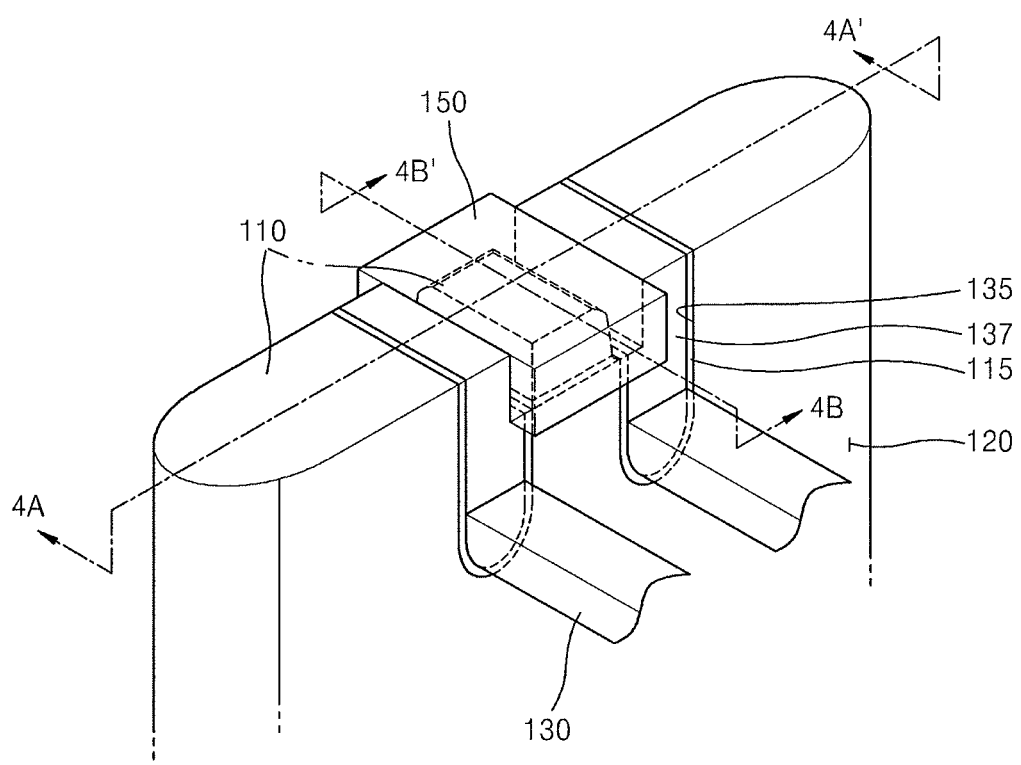
FIG. 3 illustrates a perspective view of a structure of a semiconductor device according to an embodiment.
Figure 4A:
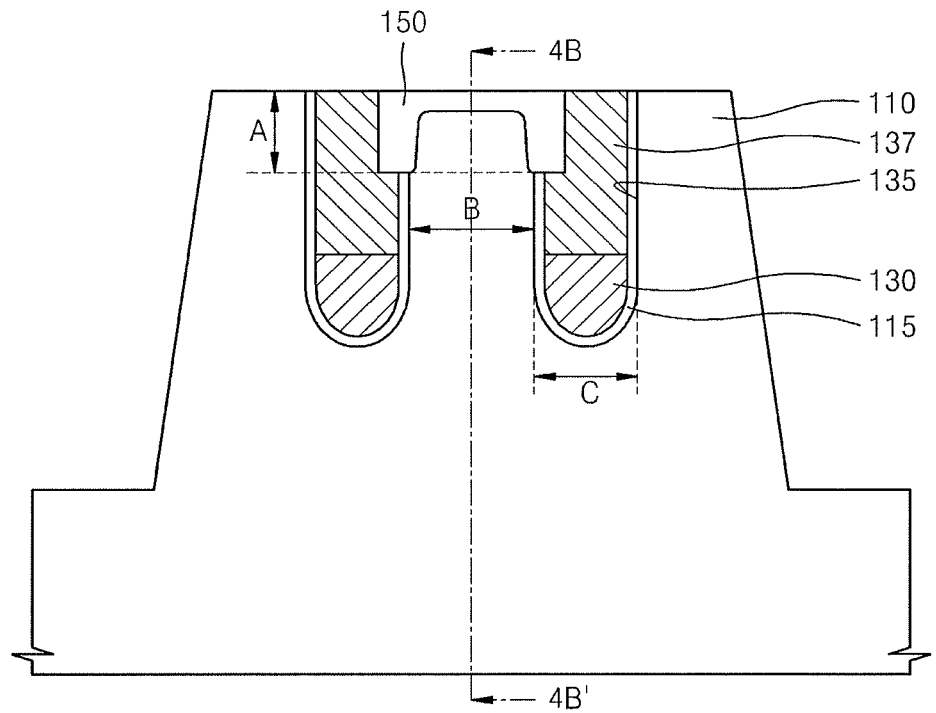
FIGS. 4A and 4B respectively illustrate cross-sectional views taken along lines 4A-4A' and 4B-4B' of FIG. 3.
Figure 4B:
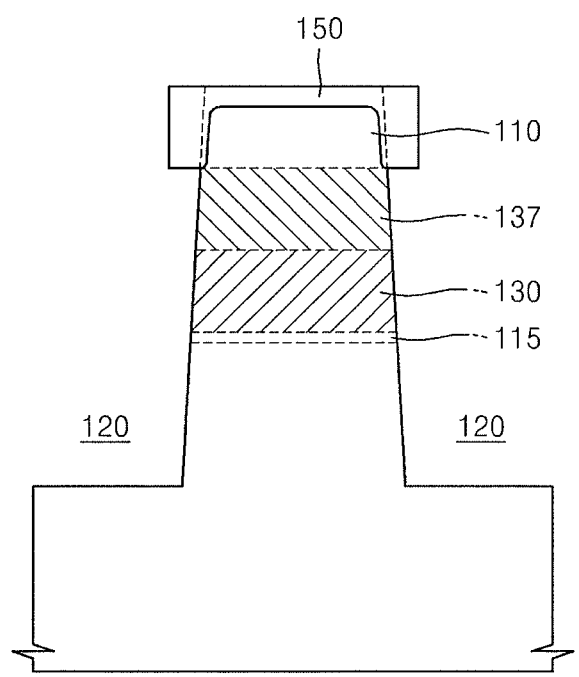

FIG. 3 is a perspective view of a structure of a semiconductor device according to an embodiment. FIGS. 4A and 4B respectively are cross-sectional views taken along lines 4A-4A' and 4B-4B' of FIG. 3. Referring to FIGS. 3, 4A, and 4B, the cell pad 150 may be disposed in the contact recess 140. The cell pad 150 may not necessarily bury the entire contact recess 140. The cell pad 150 may bury at least a portion of the contact recess 140.

In FIG. 3, a contact area where the cell pad 150 contacts the active region 110 may be greater than a cross-sectional area in a plane direction of the active region 110 that overlaps with the cell pad 150. The contact area where the cell pad 150 directly contacts the active region 110 may be greater than an area formed by projecting the contact area where the cell pad 150 contacts the active region 110 onto an arbitrary plane that is parallel to the semiconductor substrate 100.

A lower surface of the cell pad 150 may be higher than the upper surface of the word lines 130. The cell pad 150 may be formed across a boundary between the active region 110 and the gate-recesses 135 that are adjacent to the active region 110. As described above, the cell pad 150 may be formed in the contact recess 140. Accordingly, the contact recess 140 may also be formed across the boundary between the active region 110 and the gate-recesses 135 that are adjacent to the active region 110.

In particular, the entire active region 110 between the gate-recesses 135 may be completely overlapped with the cell pad 150. In this case, the entire active region 110 between the gate-recesses 135 may be completely overlapped with the contact recess 140.

Furthermore, at least a portion of the cell pad 150 may contact at least a portion of a lateral portion of the active region 110. The lateral contact may contribute to the increase in the actual contact area with respect to the projected area described above.

Referring to FIG. 4A, in the major-axis direction of the active region 110, a sidewall of the active region 110 on which the contact recess 140 is formed may be inwardly recessed with respect to a sidewall of the active region 110 that contacts the gate insulating layers 115 at a lower part of the active region 110. Also, in the major-axis direction of the active region 110, the contact recess 140 may extend into the capping layer 137. Accordingly, a step may be formed in the capping layer 137.

Referring to FIG. 4B, in a direction perpendicular to the major-axis direction of the active region 110, a sidewall of the active region 110 on which the contact recess 140 is formed may be inwardly recessed with respect to a sidewall of the active region 110 that contacts the device isolation layers 120 at a lower part of the active region 110. Also, in the direction perpendicular to the major-axis direction of the active region 110, the contact recess 140 may extend into the device isolation layers 120.

The cell pad 150 may be formed to surround the upper surface and/or side surfaces of the active region 110. The active region 110 that is surrounded by the cell pad 150 may be the active region 110 located between the gate-recesses 135. The active region 110 may have a protrusion shape in a central region of the contact recess 140. For example, at least a portion of the active region 110 having the protrusion shape may have inclined sides. In this case, the cell pad 150 may be disposed to cover the lateral surface and the upper surface of the active region 110 having the protrusion shape.

The lowest surface of the cell pad 150 may be electrically insulated from the word lines 130. Also, the lowest surface of the cell pad 150 may be separately located above the upper surfaces of the word lines 130.

Also, the upper surface of the cell pad 150 may have the same height as the upper surface of a portion of the active region 110 that does not contact the cell pad 150. However, according to various implementations, the upper surface of the cell pad 150 may be or may not be higher than the upper surface of a portion of the active region 110 that does not contact the cell pad 150.

As will be described below, the cell pad 150 may be formed by a selective epitaxial growth (SEG) method. In this case, the upper surface of the cell pad 150 may have an upwardly convex shape.

In the semiconductor device described above, a contact area between the cell pad 150 and the active region 110 may be greatly increased. Accordingly, a contact resistance may be greatly reduced. For example, when a length A in FIG. 4A is increased within a range in which the cell pad 150 and the word lines 130 are not affected by each other, the contact area between the cell pad 150 and the active region 110 is increased, thereby reducing the contact resistance.

When the contact resistance is reduced, an inter-device distance B in FIG. 4A may be decreased to some degree. This is because, even though the device distance B is decreased to some degree, the increased contact area still secures a low contact resistance.

If the inter-device distance B is reduced, a further compact cell design may be possible, and/or there may be room to increase a width C of the word lines 130. When the width C of the word lines 130 is increased, a channel length may be increased, thereby greatly improving refresh characteristics.

Figure 5:
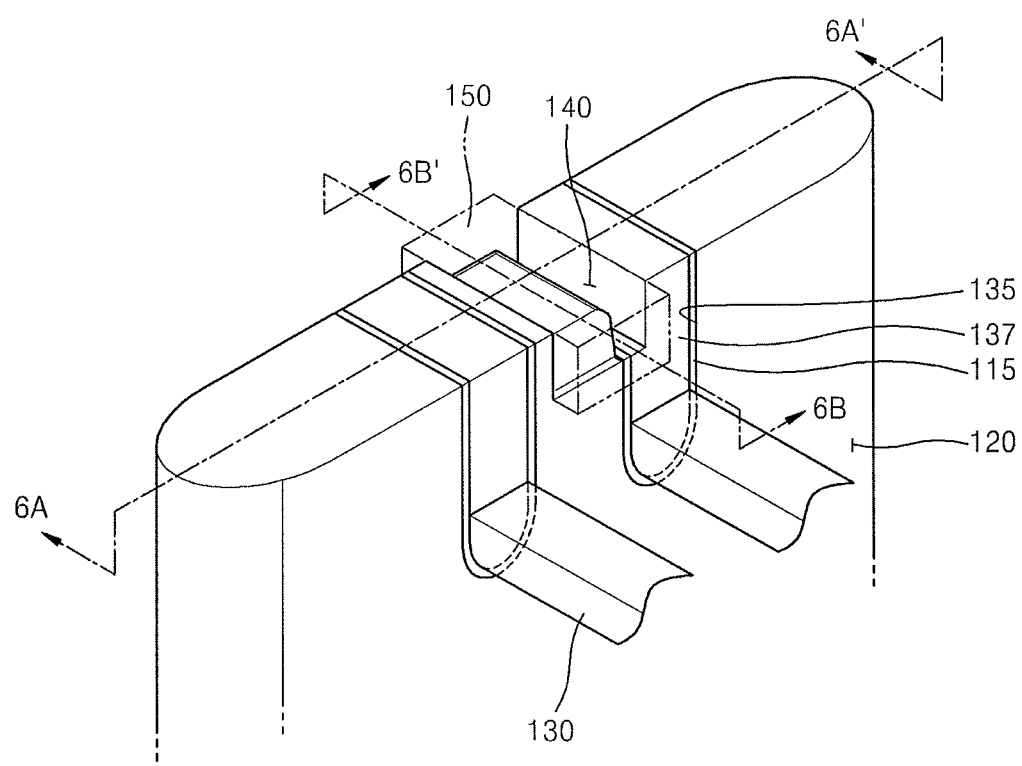
FIG. 5 illustrates a perspective view showing a portion of a structure of a semiconductor device according to another embodiment.
Figure 6A:
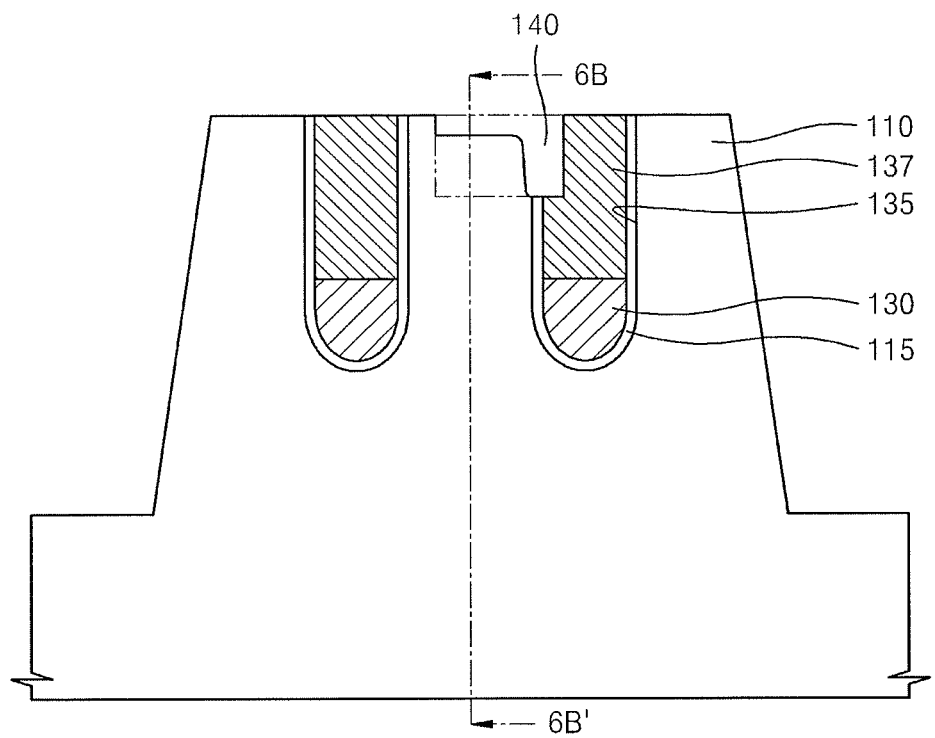
FIGS. 6A and 6B respectively illustrate cross-sectional views taken along lines 6A-6A' and 6B-6B' of FIG. 5.
Figure 6B:
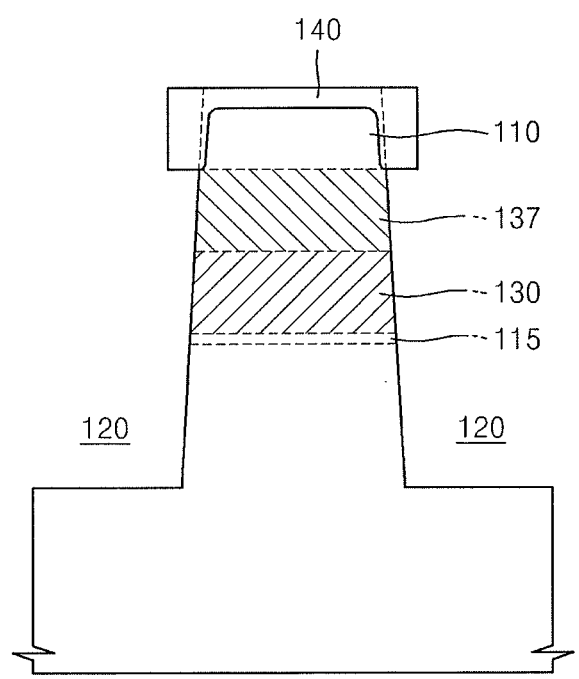

FIG. 5 is a perspective view showing a portion of a structure of a semiconductor device according to another embodiment. FIGS. 6A and 6B respectively are cross-sectional views taken along lines 6A-6A' and 6B-6B' of FIG. 5. Referring to FIGS. 5, 6A, and 6B, the contact recess 140, which is a space for forming a cell pad (not shown), is formed in a capping layer 137 and a device isolation layer 120.

The contact recess 140 may expose some portions of side surfaces of an active region 110 instead of surrounding four lateral surface of the active region 110. In this way, the contact recess 140 exposes some portions of the side surfaces of the active region 110, and a contact area between the cell pad 150 that will be formed in the contact recess 140 and the active region 110 may be increased as in the previous embodiment.

As shown in FIGS. 5 and 6A, the center of the contact recess 140 may not coincide with the center of the active region 110. A sufficiently low contact resistance may be provided although there is a slight misalignment and the cell pad 150 may be disposed with a bias in consideration of the disposition of metallization or passive devices to be disposed thereon.

FIGS. 7A through 7E are cross-sectional views sequentially depicting stages in a method of manufacturing a semiconductor device according to an embodiment.

Figure 7A:
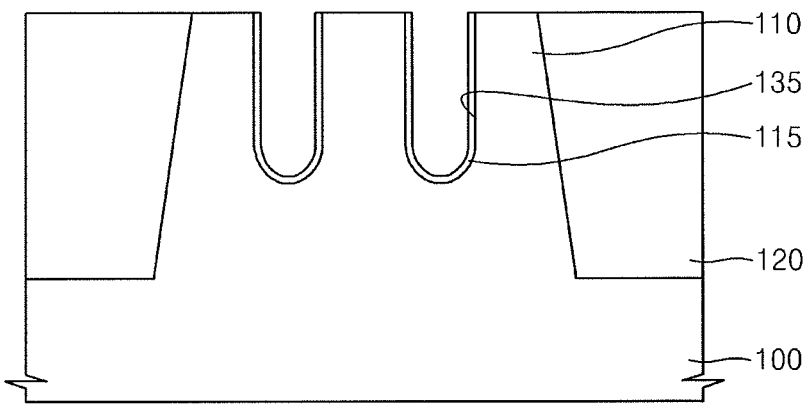
FIGS. 7A through 7E illustrate cross-sectional views sequentially depicting stages in a method of manufacturing a semiconductor device according to an embodiment.

Referring to FIG. 7A, active regions 110 separated by device isolation layers 120 may be formed on a semiconductor substrate 100. The semiconductor substrate 100, the device isolation layers 120, and the method of device isolation are described above in detail, and thus, the descriptions thereof will not be repeated.

Next, gate-recesses 135 may be formed in the active region 110, and gate insulating layers 115 may be formed on inner surfaces of the gate-recesses 135. The gate-recesses 135 may be formed using a photolithography method. The gate insulating layers 115 may be formed using, for example, a chemical vapor deposition (CVD) method or a thermal oxidation method.

Figure 7B:
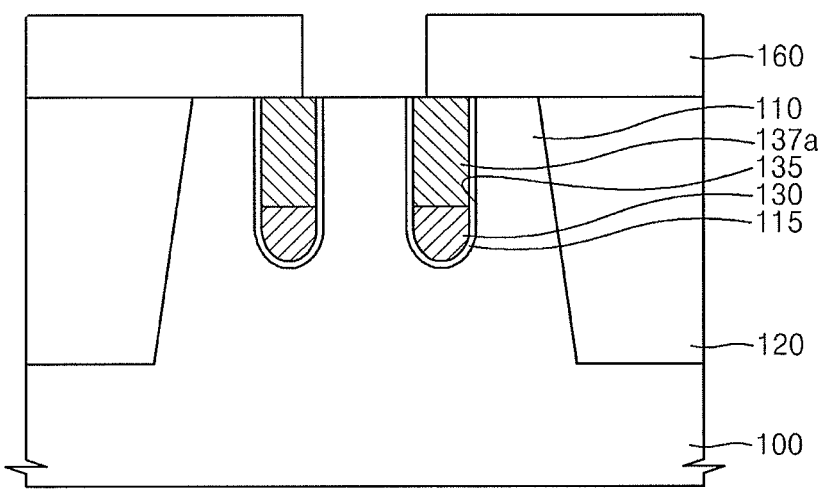

Referring to FIG. 7B, after forming a conductive layer, an etch-back process may be performed so as to form word lines 130. The conductive layer may be a metal such as tungsten (W) or a metal nitride such as TiN. After forming the conductive layer having a thickness sufficient enough to fill the gate-recesses 135, an etch-back may be performed using an anisotropic etching method such as a reactive ion etching (RIE) method to define word lines 130 in the gate-recesses 135.

Next, after forming a capping material layer having a thickness sufficient enough to fill the remaining portion of the gate-recesses 135, a capping layer 137a may be obtained by planarizing the capping material layer through an etch-back process.

Next, an interlayer insulating layer 160 may be formed on a planarized upper surface of the resultant structure, and a contact hole for forming a contact may be formed in the interlayer insulating layer 160. The contact hole may be formed using a photolithography method. At this point, in the major-axis direction of the active region 110, the contact hole may be opened sufficiently wide enough to expose a portion of the capping layer 137a.

Also, in a direction perpendicular to the major-axis direction of the active region 110, the contact hole may be opened sufficiently wide enough to expose a portion of the device isolation layer 120. When the device isolation layer 120 and the interlayer insulating layer 160 are formed of the same material, an etch-selectivity ratio may not be relied upon. Therefore, in order to form the contact hole having a desired depth, the contact hole may be formed by timing the etching.

Figure 7C:
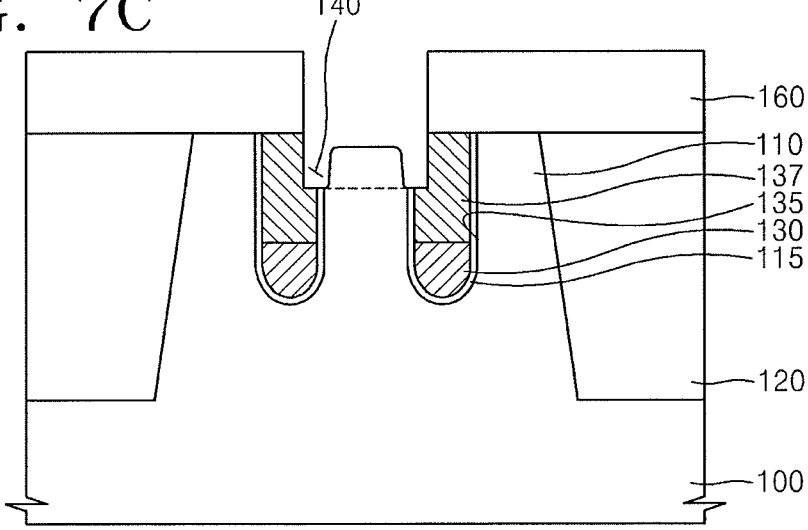

Referring to FIG. 7C, in order to form the contact recess 140, the active region 110, the gate insulating layer 115, and the capping layer 137 exposed through the contact hole may be removed by etching to a predetermined depth. At this point, a portion of the device isolation layer 120 that is exposed by the contact hole may also be removed by being etched to a predetermined depth.

Figure 7D:
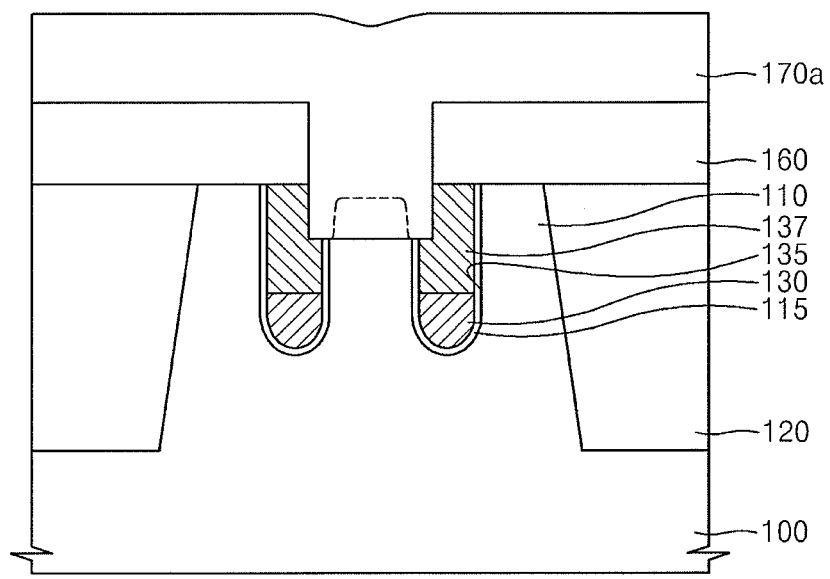

Referring to FIG. 7D, the contact hole may be filled with a conductive material 170a. The conductive material 170a may be a doped polysilicon, a metal, or a metal nitride. The conductive material 170a may be formed using a deposition method such as a CVD method.

In FIG. 7D, as an example, the conductive material 170a may be filled in the contact hole at once. However, in another implementation, only a cell pad may be formed in the contact hole by an SEG method. Afterwards, a cell direct contact may be formed by filling the remaining portion of the contact hole with the conductive material 170a on the cell pad.

According to an implementation shown in FIG. 3, a cell pad having a planarized upper surface having the same level as the upper surface of the active regions 110 on both sides of the contact hole may be formed by performing an etch-back of the conductive material 170a of FIG. 7D. In this case, a cell direct contact may be additionally formed with respect to the remaining portion of the contact hole.

Figure 7E:
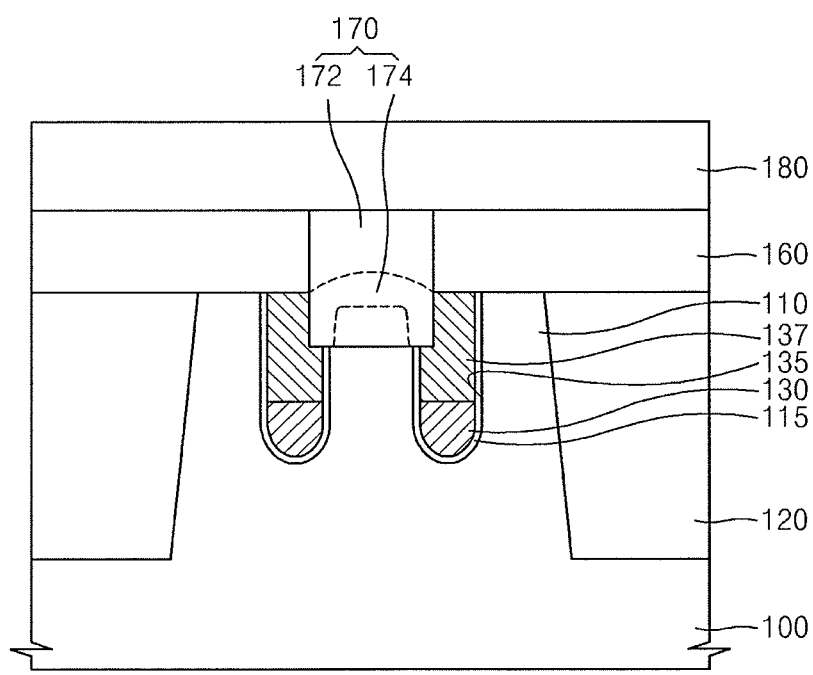

Referring to FIG. 7E, a contact plug 170 may be formed in the contact hole through a planarization or an etch-back. The contact plug 170 may be formed as one body or, as shown in FIG. 7E, may include a cell pad 174 and a cell direct contact 172 formed separately from each other. As described above, the cell pad 174 may be formed by an SEG method. In this case, an upper surface of the cell pad 174 may have an interface having an upwardly convex shape.

Also, as described in the optional example, when the cell pad 174 is formed through an etch-back, the upper interface of the cell pad 174 may be planar.

Next, a bit line 180 may be formed on the interlayer insulating layer 160 and the contact plug 170. The bit line 180 may be formed of a material selected from titanium nitride TiN, titanium/titanium nitride (Ti/TiN), tungsten nitride WN, tungsten/tungsten nitride (W/WN), tantalum nitride TaN, tantalum/tantalum nitride (Ta/TaN), titanium silicon nitride (TiSiN), tungsten silicon nitride (WSiN), and a composite of these materials; however, other materials are possible.

The bit line 180 may be formed by forming a bit line material layer using a CVD method, a physical vapor deposition (PVD) method, or an atomic layer deposition (ALD) method and then patterning the bit line material layer using a photolithography method. When copper Cu is used for the bit line 180, a damascene method or a dual damascene method may be used.

The bit line 180 may have a uniform width or, as depicted in FIG. 1, may have an increased width at a portion where the bit line 180 contacts the contact plug 170 so as to secure an aligning margin of the portion between the bit line 180 and the contact plug 170.

Figure 8:
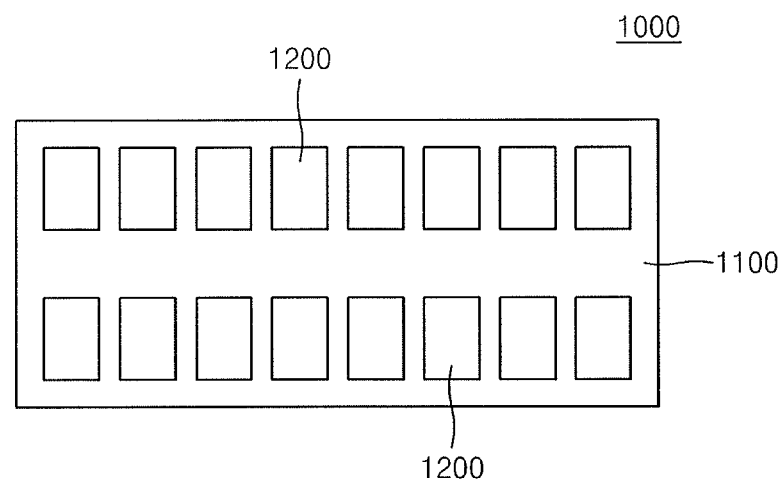
FIG. 8 illustrates a plan view of a memory module including a semiconductor device according to an embodiment.

FIG. 8 is a plan view of a memory module 1000 including a semiconductor device according to an embodiment.

The memory module 1000 may include a printed circuit board 1100 and a plurality of semiconductor packages 1200.

Each of the semiconductor packages 1200 may include a semiconductor device according to the embodiments. In particular, each of the semiconductor packages 1200 may include a characteristic structure of at least one of the semiconductor devices according to the embodiments described above.

The memory module 1000 according to the embodiment may be a single in-lined memory module (SIMM) in which a plurality of the semiconductor packages 1200 are mounted on a side of the printed circuit board 1100 or a dual in-lined memory module (DIMM) in which a plurality of the semiconductor packages 1200 are mounted on both sides of the printed circuit board 1100. Also, the memory module 1000 may be a fully buffered DIMM (FBDIMM) having an advanced memory buffer (AMB) that supplies signals received from the outside to the semiconductor packages 1200.

Figure 9:
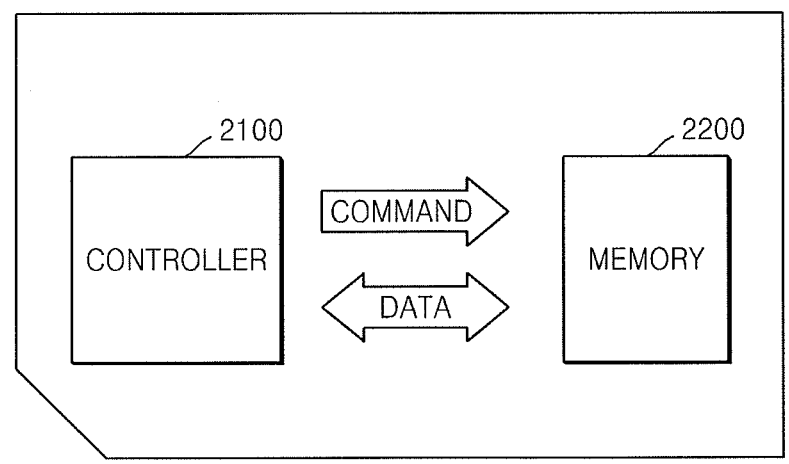
FIG. 9 illustrates a block diagram of a memory card including a semiconductor device according to an embodiment.

FIG. 9 is a block diagram of a memory card 2000 including a semiconductor device according to an embodiment.

The memory card 2000 may be configured so that a controller 2100 and a memory 2200 exchange electrical signals with each other. For example, when a command is given to the memory 2200, the memory 2200 may transmit data.

The memory 2200 may include a semiconductor device according to the embodiments. In particular, the memory 2200 may include a characteristic structure of at least one of the semiconductor devices according to the embodiments.

The memory card 2000 may constitute one of various memory cards, for example, a memory stick card, a smart media (SM) card, a secure digital (SD) card, a mini-secure digital (mini-SD) card, and a multimedia card (MMC).

Figure 10:
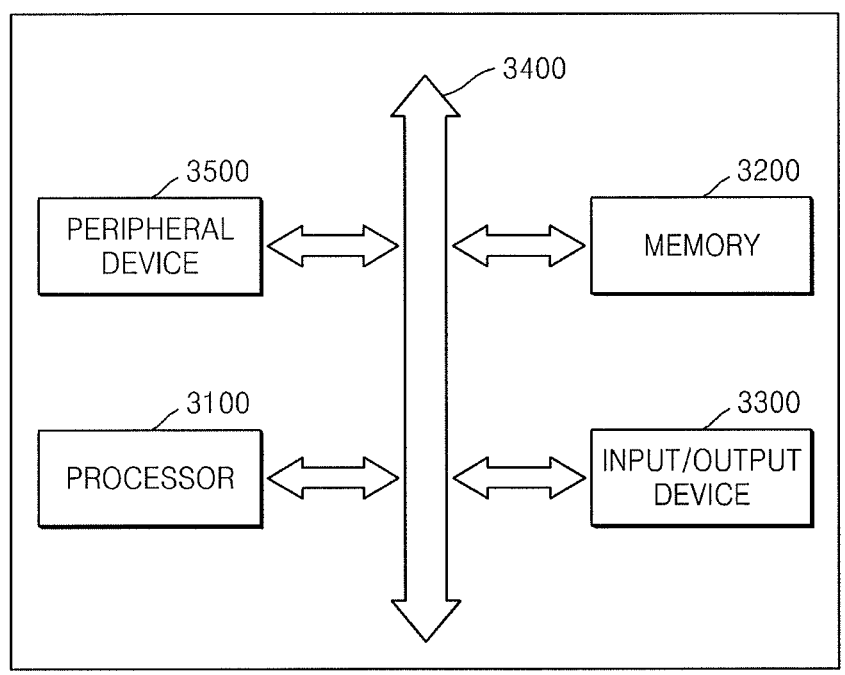
FIG. 10 illustrates a block diagram of a system including a semiconductor device according to an embodiment.

FIG. 10 is a block diagram of a system 3000 including a semiconductor device according to an embodiment.

In the system 3000, a processor 3100, a memory 3200, and an input/output device 3300 may mutually communicate through a bus 3400.

The memory 3200 of the system 3000 may include a random access memory (RAM) and/or a read only memory (ROM). Also, the system 3000 may include peripheral devices 3500 such as a floppy disk drive and a CD (compact disk) ROM drive.

The memory 3200 may include a semiconductor device according to the embodiments. In particular, the memory 3200 may include a characteristic structure of at least one of the semiconductor devices according to the embodiments described above.

The memory 3200 may store codes and data for operating the processor 3100.

The system 3000 may be used in mobile phones, MP3 players, navigation devices, portable multimedia players (PMPs), solid state disks (SSDs), or household appliances, etc.

By way of summation and review, in order to secure a margin through which a direct-contact contacts an upper surface of an active region, it may be difficult to extend a width of the direct-contact. Due to continuous reduction of device sizes, an area of the upper surface of the active region that contacts the direct contact may be reduced, thereby increasing a direct contact resistance.

In contrast, embodiments relate to a semiconductor device having a relatively low resistance between a direct contact and an active region and relatively improved refresh characteristics. For example, a contact area between a direct contact and an active region may be increased by providing a configuration such that the direct contact not only may contact the upper surface but also may contact lateral side portions of the active region. In order to provide lateral side portions of the active region for the direct contact to contact, recesses may be formed by etching a portion of a device isolation layer and/or a capping layer on word lines, and exposing lateral sides of the active region. Then, the direct contact may be formed extending into the recesses, thereby increasing the contact area between the direct contact and the active region. Embodiments may provide a memory module and a system including the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region on a semiconductor substrate, the active region being defined by a device isolation layer and including gate-recesses;
gate electrodes and a capping layer in the gate-recesses;
a contact recess in a portion of the active region between the gate-recesses, the contact recess defining at least one side surface of the active region facing and spaced apart from a side surface of the capping layer;
a cell pad that covers at least the portion of the active region between the gate-recesses and that fills at least a portion of the contact recess, at least a portion of the cell pad contacting the active region between the side surface of the active region and the side surface of the capping layer; and
a bit line electrically connected to the cell pad.

2. The semiconductor device as claimed in claim 1, wherein an upper surface of the gate electrode is lower than an upper surface of the active region, and the capping layer is in a space between the upper surface of the gate electrode and the upper surface of the active region, the capping layer being an insulating material.

3. The semiconductor device as claimed in claim 2, wherein a lowermost bottom surface of the contact recess is higher than the upper surface of the gate electrode.

4. The semiconductor device as claimed in claim 1, wherein the contact recess is in the portion of the active region between the gate-recesses and extends across a boundary of the active region.

5. The semiconductor device as claimed in claim 4, wherein the portion of the active region between the gate-recesses is completely covered by the cell pad.

6. The semiconductor device as claimed in claim 5, wherein a portion of the active region between the gate-recesses has a protrusion shape at a center of the contact recess, and the cell pad covers a side surface and an upper surface of the active region having the protrusion shape.

7. The semiconductor device as claimed in claim 4, wherein the bit line is electrically connected to the cell pad through a cell direct contact.

8. The semiconductor device as claimed in claim 1, wherein a contact area between the portion of the active region between the gate-recesses and the cell pad is greater than a cross-sectional area in a plane direction of the active region that overlaps with the cell pad.

9. The semiconductor device as claimed in claim 1, wherein the cell pad is formed by a selective epitaxial growth method.

10. The semiconductor device as claimed in claim 1, wherein an upper surface of the cell pad has an upwardly convex shape.

11. The semiconductor device as claimed in claim 1, wherein the cell pad and the cell direct contact are formed as one body.

12. A semiconductor memory module comprising the semiconductor device as claimed in claim 1.

13. A system comprising the semiconductor device as claimed in claim 1.

14. A semiconductor device, comprising:
an active region on a semiconductor substrate, the active region being defined by a device isolation layer and including at least one gate-recess;
a gate electrode in the gate-recess;
a contact that contacts at least a portion of an upper surface of the active region, at least a portion of a lateral surface of the active region, and at least a portion of a lateral surface of a layer in the gate-recess, the contact being between the lateral surface of the active region and the lateral surface of the layer in the gate-recess; and
a bit line connected to the contact.

15. The semiconductor device as claimed in claim 14, wherein the layer in the gate-recess includes a capping layer the capping layer being on the gate electrode, the contact contacting at least a portion of a lateral surface of the capping layer.

* * * * *